US008669886B2

(12) United States Patent
Chen

(10) Patent No.: US 8,669,886 B2
(45) Date of Patent: Mar. 11, 2014

(54) DATA ENTRY MODULE

(75) Inventor: Li De Chen, Nantou County (TW)

(73) Assignee: Xac Automation Corp., Hsinchu (TW)

( * ) Notice: Subject to any disclaimer, the term of this patent is extended or adjusted under 35 U.S.C. 154(b) by 759 days.

(21) Appl. No.: 12/914,107

(22) Filed: Oct. 28, 2010

(65) Prior Publication Data

US 2012/0105258 A1 May 3, 2012

(51) Int. Cl.
*H03M 11/00* (2006.01)

(52) U.S. Cl.
USPC ............. 341/22; 340/550; 340/568.1; 109/42

(58) Field of Classification Search
USPC ............... 341/20-22; 340/568.1, 550; 109/42
See application file for complete search history.

(56) References Cited

U.S. PATENT DOCUMENTS 4,954,811 A * 9/1990 Chatigny et al. .............. 340/550
5,285,734 A * 2/1994 MacPherson ................... 109/42
5,289,785 A * 3/1994 MacPherson et al. .......... 109/42
5,506,566 A * 4/1996 Oldfield et al. ............... 340/550
5,568,124 A * 10/1996 Joyce et al. ................... 340/550
5,858,500 A * 1/1999 MacPherson ................... 428/68
7,065,656 B2 * 6/2006 Schwenck et al. ............ 713/194
7,270,275 B1 * 9/2007 Moreland et al. ............. 235/492
2003/0137416 A1 * 7/2003 Fu et al. ..................... 340/568.1
2008/0278353 A1 * 11/2008 Smith et al. ..................... 341/22

* cited by examiner

*Primary Examiner* — Albert Wong

(74) *Attorney, Agent, or Firm* — WPAT, P.C.; Anthony King; Kay Yang

(57) ABSTRACT

A data entry module includes a flexible substrate, a fence circuit formed on the flexible substrate and including at least one trace routed in a meandering manner, an insulating layer formed on the fence circuit, a substrate spaced from the insulating layer, and a switch circuit including a plurality of switch elements each including two contact pads separately disposed on the substrate and the insulating layer. The fence circuit is configured to cover the switch circuit for preventing the interrogation of the switch circuit.

8 Claims, 13 Drawing Sheets

DATA ENTRY MODULE

BACKGROUND OF THE INVENTION

1. Field of the Invention

The present invention relates to a data entry module.

2. Description of the Related Art

Point of Sale (POS) terminals and automatic teller machines (ATM) allow users to make transactions locally and quickly. Accordingly, increasing numbers of people rely on POS terminals or ATMs to complete their transactions.

All POS or ATM transactions require the entry of a PIN (Personal Identification Number) through a PIN entry device/terminal. The PIN entry device may include a membrane switch assembly including a membrane and a substrate spaced from the membrane, and a matrix of keys operated by fingers to apply pressure on the membrane against the substrate. Finger pressure applied to a switch of the membrane switch assembly pushes a conductive pad on the membrane into contact with a corresponding pad on the substrate such that the switch is closed and a number is entered.

To protect secure data, a tamper-resistant security system is provided to secure the PIN entry device. If a PIN entry device is opened, the tamper-resistant security system is activated and all secure data is deleted. As a result, the secure data can be protected.

For operability, the membrane of the membrane switch assembly is usually made of elastic plastic film, which is vulnerable to physical damage. Although the PIN entry device is secured by a tamper-resistant security system, attackers may easily penetrate the membrane, tap the circuit in the membrane switch, and obtain entered PINs if the tamper-resistant security system fails or is disabled or bypassed. Therefore, the secure data in conventional PIN entry devices is not completely secured.

SUMMARY OF THE INVENTION

One objective of the present invention is to prevent the circuit in the membrane switch of a data entry module from being tapped through a membrane.

Another objective of the present invention is to provide a tamper component in the membrane switch for preventing the data entry module and/or the membrane switch from being tampered with.

The present invention discloses a data entry module that comprises a flexible substrate, a fence circuit, an insulating layer, a substrate, and a switch circuit. The fence circuit is formed on the flexible substrate and includes at least one trace routed in a meandering manner. The insulating layer is formed on the fence circuit. The substrate is spaced from the insulating layer. The switch circuit includes a plurality of switch elements, each of which includes two contact pads, wherein one contact pad is disposed on the substrate and another contact pad is disposed on the insulating layer. The fence circuit is configured to cover the switch circuit for preventing the interrogation of the switch circuit.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

Figure 1:
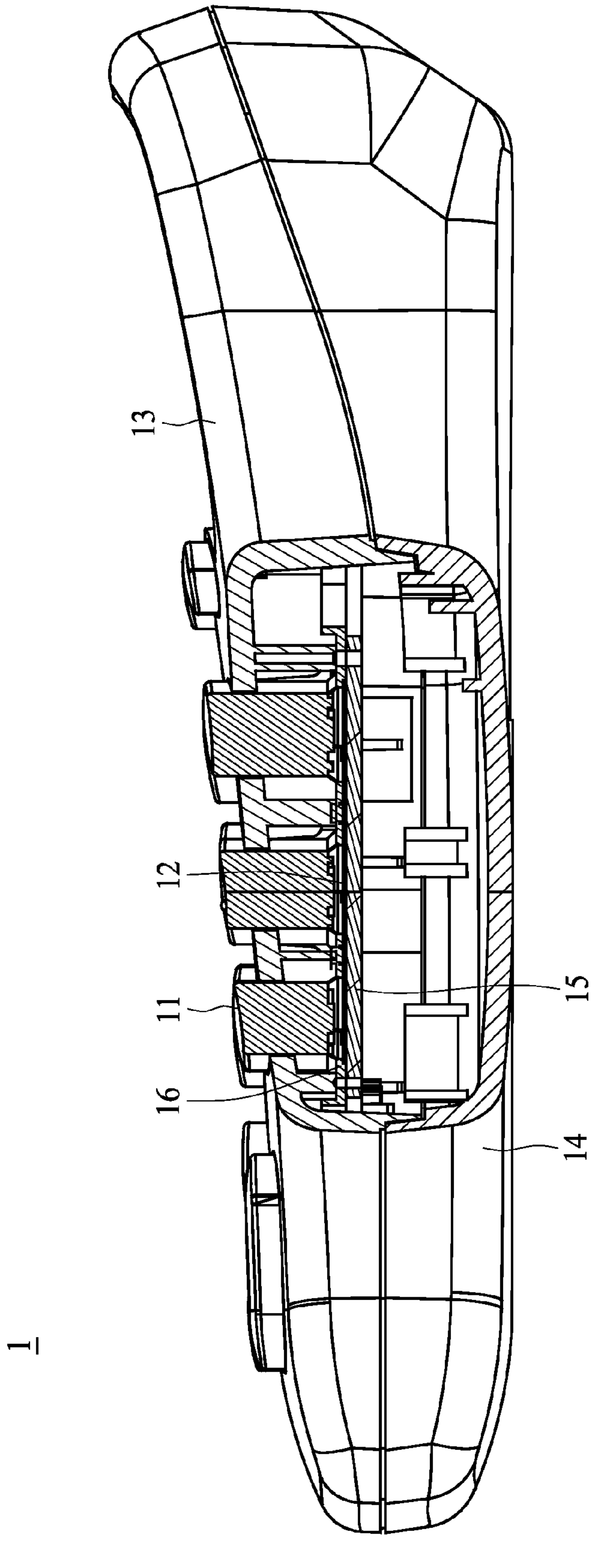
FIG. 1 is a partially fragmentary sectional view showing a data entry module according to one embodiment of the present invention.

FIG. 1 is a partially fragmentary sectional view showing a data entry module 1 according to one embodiment of the present invention. Referring to FIG. 1, the data entry module 1 comprises a plurality of keys 11, a membrane switch assembly 12 adjacent to the bottom portions of the keys 11, a front housing 13, and a rear housing 14. The front housing 13 and the rear housing 14 are securely fastened together. The membrane switch assembly 12 is disposed in the assembled front housing 13 and rear housing 14. The front housing 13 includes a plurality of openings each receiving the corresponding key 11 and configured to allow the corresponding key 11 to move in a sliding manner therein.

Figure 2:
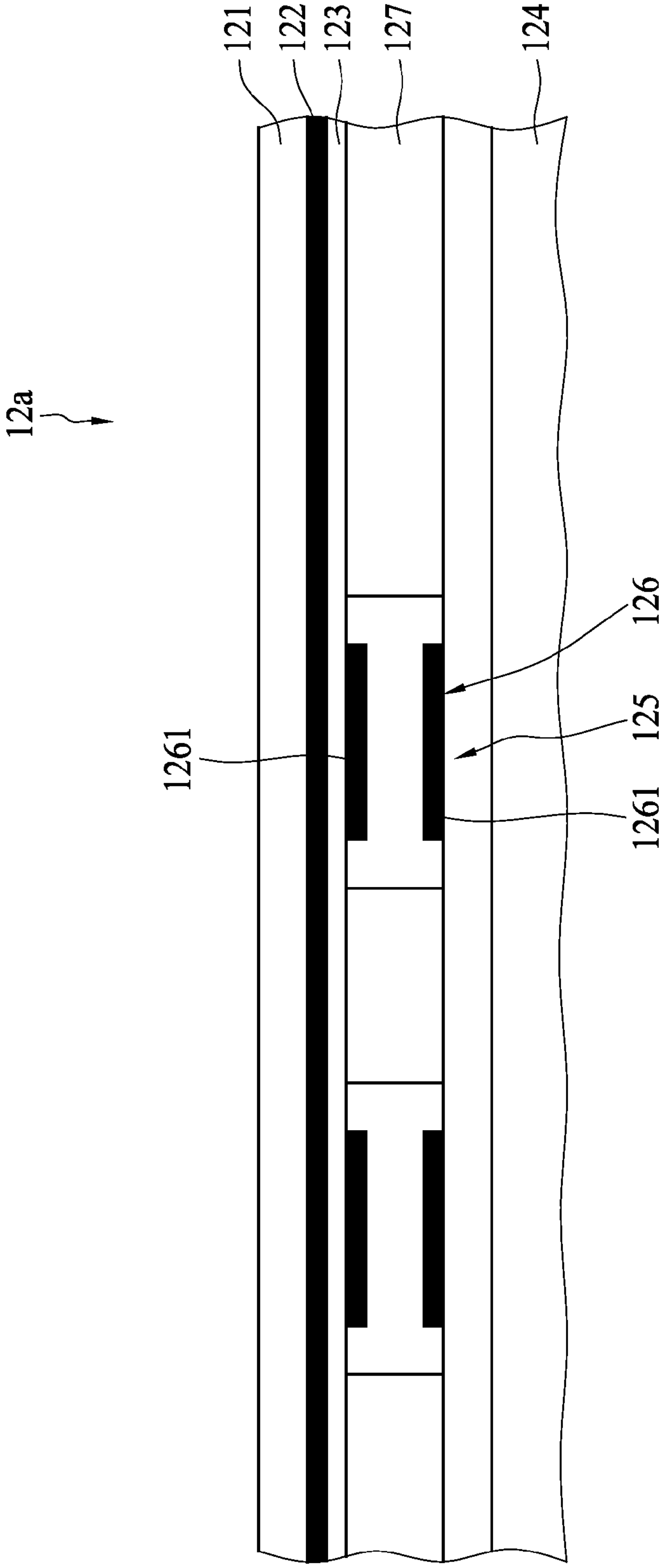
FIG. 2 is a cross-sectional view showing a membrane switch assembly according to the first embodiment of the present invention.

FIG. 2 is a cross-sectional view showing a membrane switch assembly 12*a* according to the first embodiment of the present invention. Referring to FIG. 2, the membrane switch assembly 12*a* of the present embodiment comprises a flexible substrate 121 deflectable in response to an applied actuating force, a fence circuit 122 formed on the flexible substrate 121, an insulating layer 123 formed on the fence circuit 122, a substrate 124 spaced away from the insulating layer 123, and the switch circuit 125 disposed between the insulating layer 123 and the substrate 124.

Referring to FIGS. 1 and 2, the switch circuit 125 may include a plurality of normally open switch elements 126 corresponding to the keys 11. In operation, when one key 11 is pressed, the bottom portion of the key 11 locally depresses the flexible substrate 121, closing the corresponding switch element 126, triggering an appropriate signal for identification of the key to a monitoring circuit.

Specifically, each switch element 126 comprises a pair of contact pads 1261 configured to separate from each other and separately formed on the insulting layer 123 and the substrate 124. When a key 11 is pressed, the flexible substrate 121 deforms locally, moving the contact pad 1261 on the flexible substrate 121 to engage with another contact pad 1261 on the substrate. Consequently, a signal representing the key is generated.

In the present embodiment, the membrane switch assembly 12*a* includes a spacer 127 disposed between the insulating layer 123 and the substrate 124 for separating the insulating layer 123 and the substrate 124. The spacer 127 includes a plurality of apertures corresponding to the switch elements 126, and the aperture 127 is configured to allow two corresponding contact pads 1261 to engage with each other when the switch element 126 is pressed to close.

Figure 3:
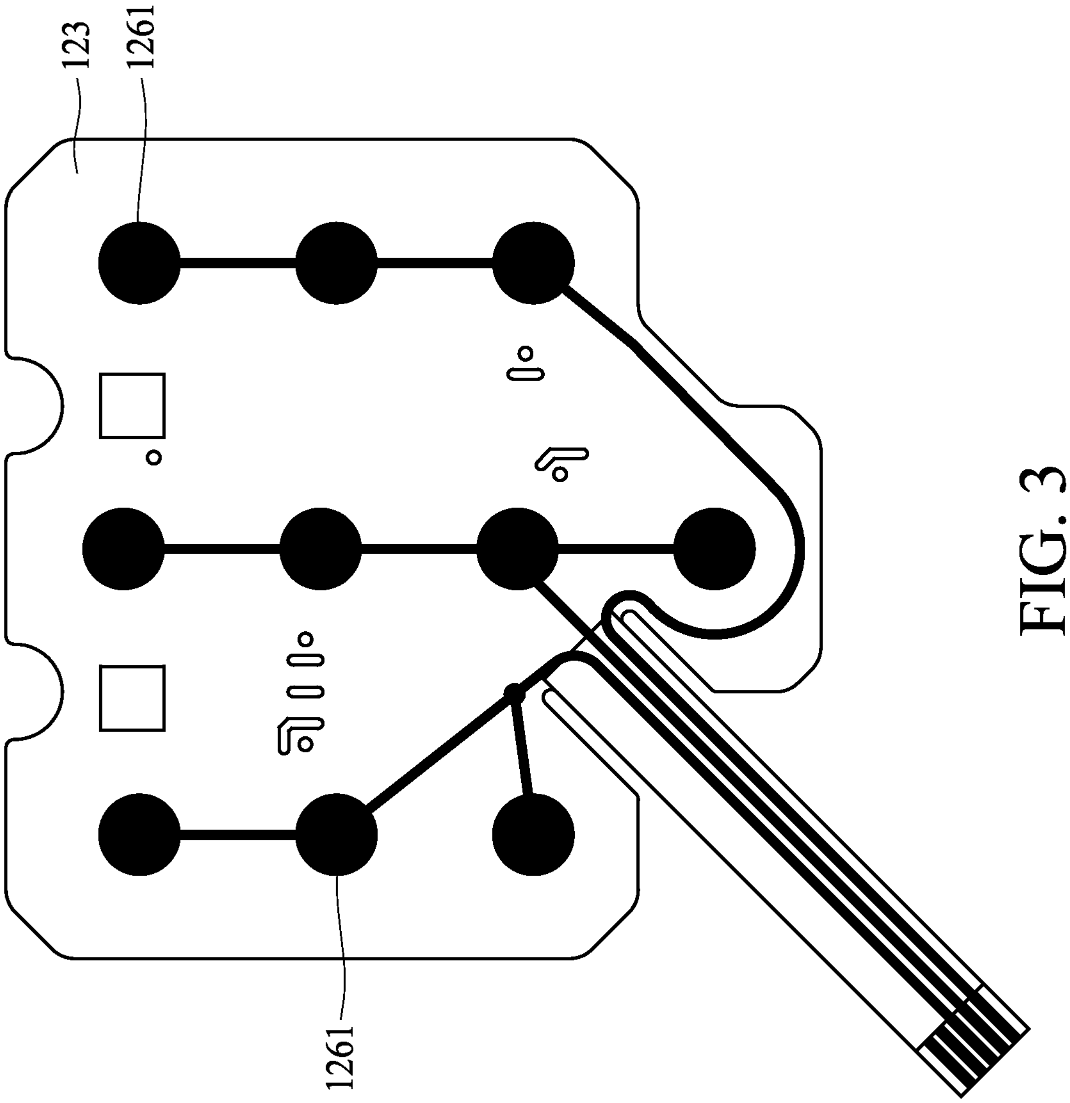
FIG. 3 is a view showing the contact pads formed on an insulating layer on a flexible substrate according to one embodiment of the present embodiment.
Figure 4:
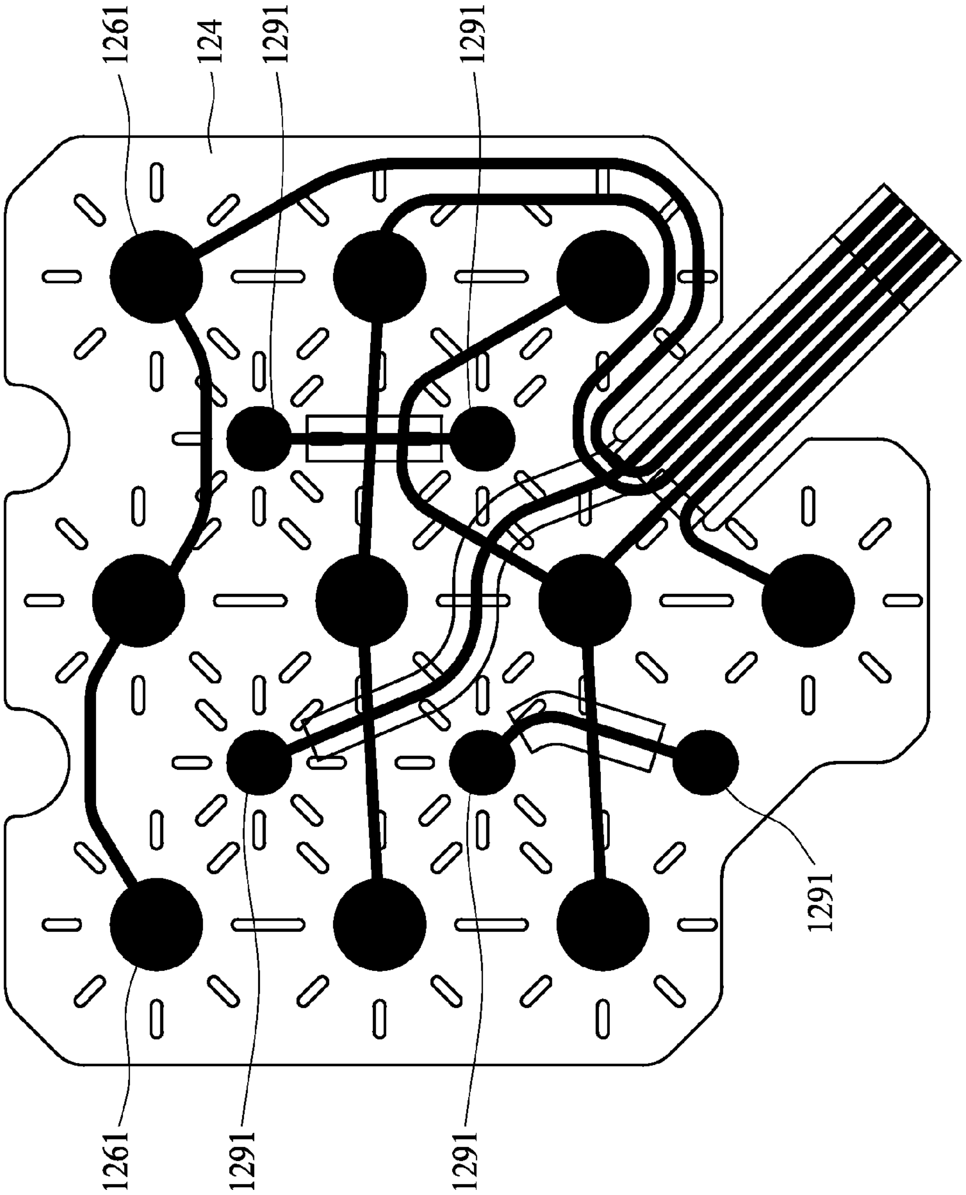
FIG. 4 is a view showing the contact pads formed on a substrate according to one embodiment of the present invention.

FIG. 3 is a view showing the contact pads 1261 formed on an insulating layer 123 on a flexible substrate 121 according to one embodiment of the present embodiment. FIG. 4 is a view of the contact pads 1261 formed on a substrate 124 according to one embodiment of the present invention. Referring to FIGS. 3 and 4, the contact pads 1261 on the insulating layer 123 and the contact pads 1261 on the substrate 124 can be arranged in 4 (horizontal) rows and 3 (vertical) columns. The contact pads 1261 on the insulating layer 123 and the contact pads 1261 on the substrate 124 can be configured as a switch matrix. For instance, on the insulating layer 123 the contact pads 1261 are interconnected column-wise, while on the substrate 124 the contact pads 1261 are interconnected row-wise.

In addition, the contact pads 1261 on the insulating layer 123 and the substrate 124 can be deposited using known techniques. In one embodiment, the contact pads 1261 and the traces connecting the corresponding contact pads 1261 can be formed using a thin film process such as a screen-printing process.

Figure 5:
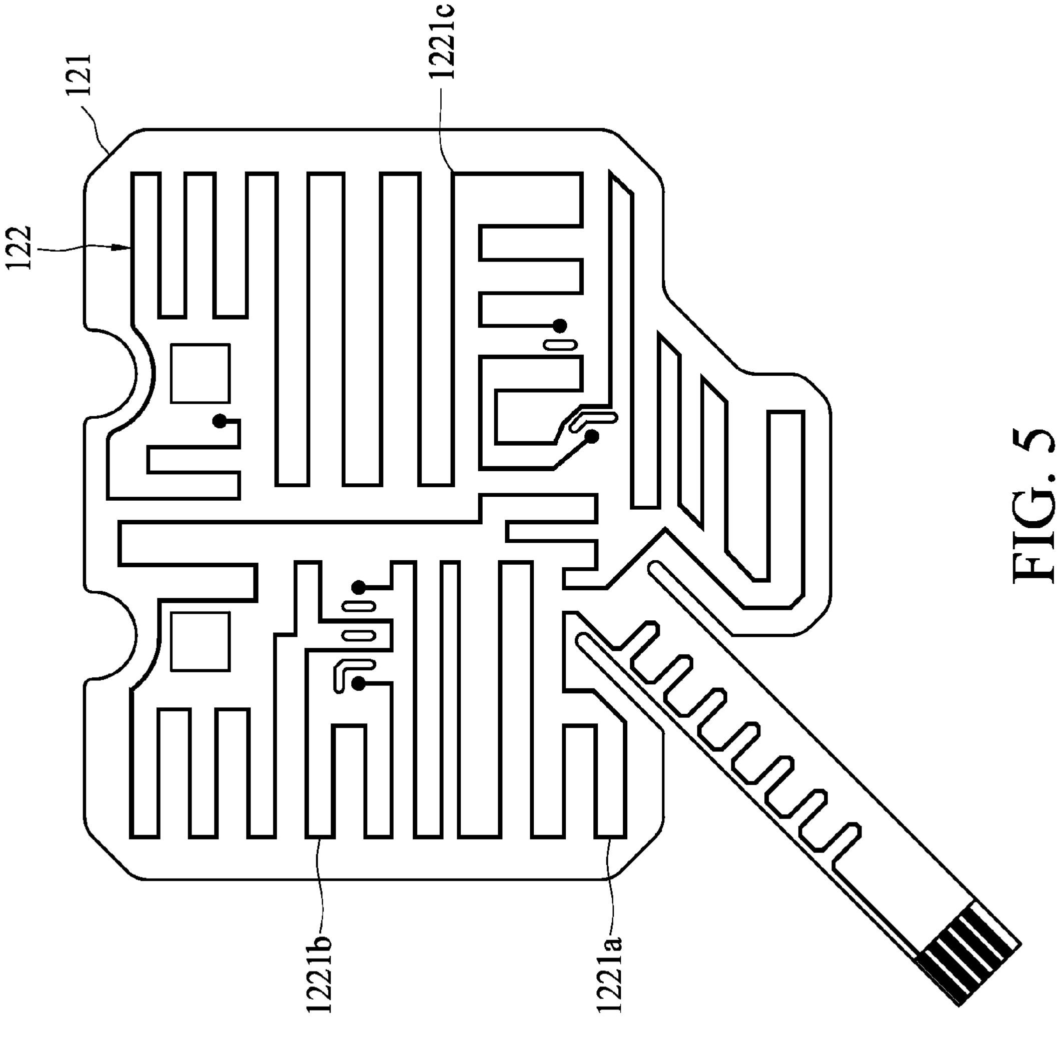
FIG. 5 is a view showing a fence circuit according to one embodiment of the present invention.

FIG. 5 shows a fence circuit 122 according to one embodiment of the present invention. The fence circuit 122 is formed on the flexible substrate 121, configured to cover the switch circuit 125, and insulated from the contact pads 1261 by the insulating layer 123. The fence circuit 122 may comprise at least one trace 1221 routed throughout the circuit. The at least one trace 1221 can be arranged in a meandering manner and spaced such that an attempt of the interrogation of the contact pads 1261 and their connecting traces through the flexible substrate 121 may break the trace of the fence circuit 122, triggering an alarm signal.

In one embodiment, the fence circuit 122 can be formed using a thin film process such as a screen-printing process.

Figure 6:
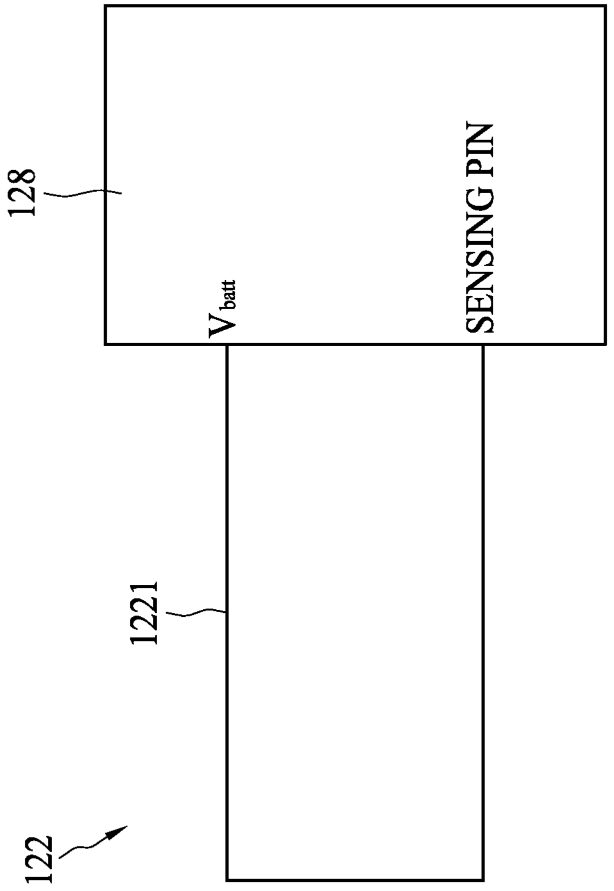
FIG. 6 is a schematic diagram showing a circuit connected to a fence circuit according to one embodiment of the present invention.

FIG. 6 is a schematic diagram showing a circuit 128 connected to a fence circuit 122 according to one embodiment of the present invention. Referring to FIG. 6, in the present embodiment, the single trace 1221 is connected to $V_{batt}$ and the sensing pin of a circuit 128. If the trace 1221 is broken, the status of the sensing pin will be changed such that the stored content of the circuit 128 will be erased.

Figure 7:
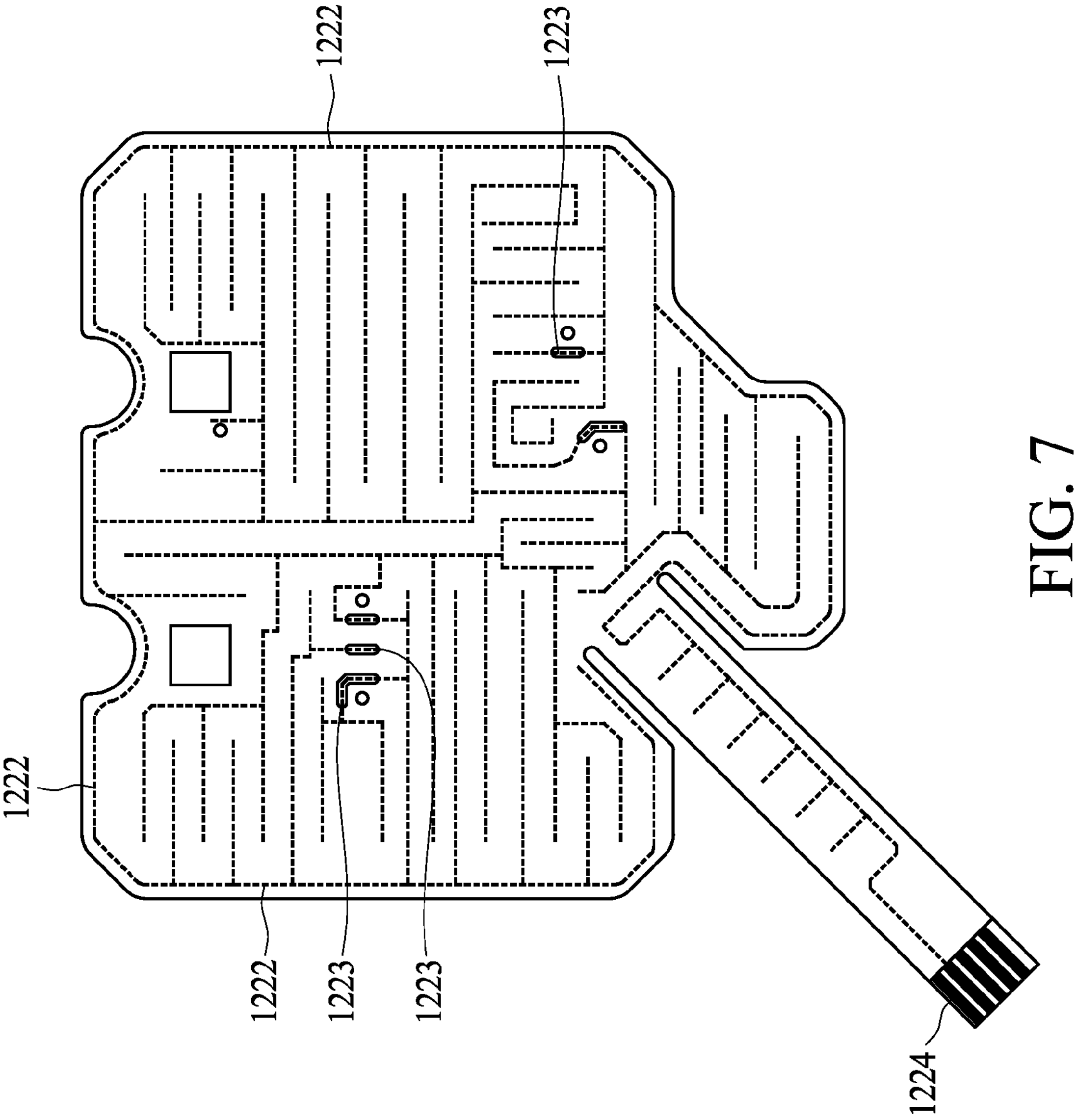
FIG. 7 is a view showing the layout of a plurality of ground traces included in a fence circuit according to one embodiment of the present invention.
Figure 8:
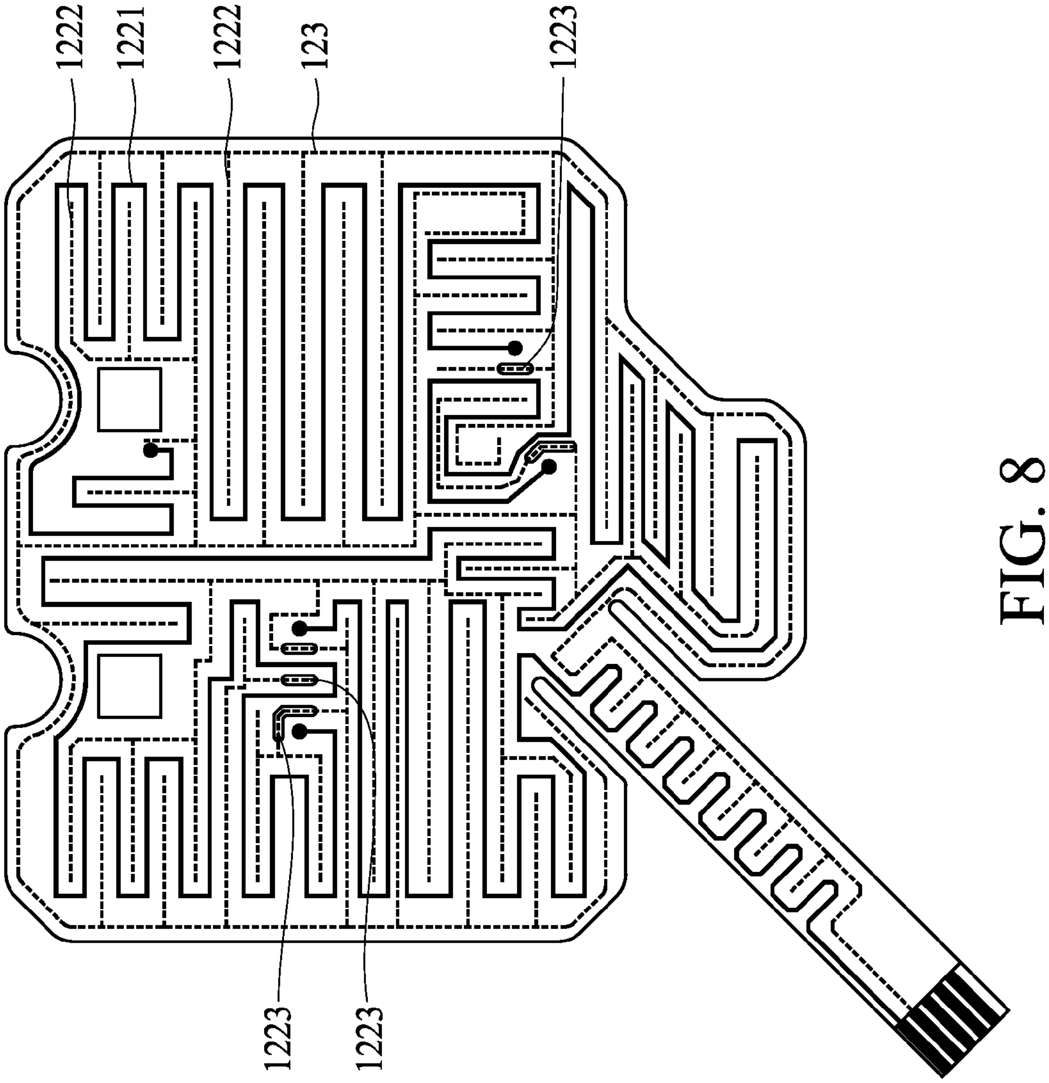
FIG. 8 is a view showing the layout of a fence circuit including a plurality of ground traces and at least one trace according to one embodiment of the present invention.

FIG. 7 is a view showing the layout of a plurality of ground traces 1222 included in a fence circuit 122 according to one embodiment of the present invention. FIG. 8 is a view showing the layout of a fence circuit 122 including a plurality of ground traces 1222 and at least one trace 1221 according to one embodiment of the present invention. Referring to FIGS. 7 and 8, the fence circuit 122 may include at least one trace 1221 and a plurality of ground traces 1222. The at least one trace 1221 continuously meanders throughout the surface of the flexible substrate 121 with its adjacent extending portions spaced apart a distance allowing the corresponding ground trace 1222 to extend between the adjacent extending portions. Such an arrangement may cause short-circuiting between the at least one trace 1221 and the ground traces 1222, resulting in changing the status of the sensing pin of a circuit 128 in case of an attempt to penetrate the fence circuit 122 for the interrogation of the contact pads 1261 and their connecting traces.

The ground traces 1222 can be connected together on the flexible substrate 121 to have a labyrinthine configuration and to form a single external connection point as shown in FIG. 7. In the present embodiment, a ground trace 1222 can extend following the periphery of the flexible substrate 121 and connect to an external connection point 1224, and other ground traces 1222 directly and indirectly connect to the peripherally routing ground trace 1222. In the ground traces 1222 other than the peripherally routing ground trace 1222, some of the ground traces 1222 are joined to form bifurcated configurations.

In addition, a plurality of openings 1223 can be formed on the insulating layer 123 to expose a portion of a corresponding ground trace 1222 for preventing one type of attack. An attacker may expose two points of the at least one trace and utilize conductive adhesive to cause short-circuiting between two exposed points. When the conductive adhesive is applied, the conductive adhesive may flow into the openings 1223, short-circuiting the ground traces 1222 and the trace 1221, triggering an alarm signal.

Referring to FIGS. 1 and 2 again, in one embodiment, the substrate 124 can be a flexible plastic substrate such as a PET (polyethylene terephthalate) film. The data entry module 1 may include a support member 15 for supporting the substrate 124. In one embodiment, the support member 15 can be a printed circuit board. In another embodiment, the support member 15 is a printed circuit board, and the substrate 124 is the support member 15.

Figure 9:
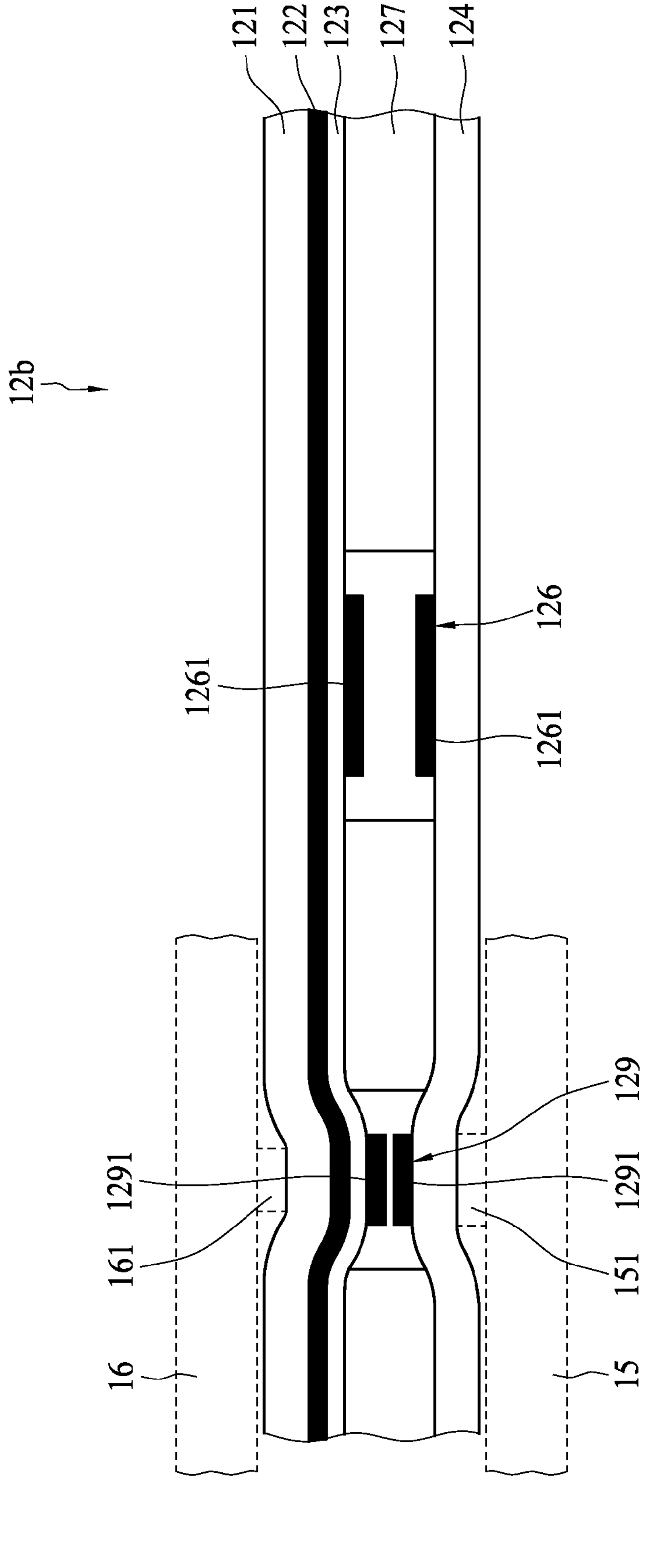
FIG. 9 is a cross-sectional view showing a membrane switch assembly according to the second embodiment of the present invention.

FIG. 9 is a cross-sectional view showing a membrane switch assembly 12*b* according to the second embodiment of the present invention. Referring to FIG. 9, the membrane switch assembly 12*b* may comprise a flexible substrate 121, a substrate 124, a fence circuit 122 formed on the flexible substrate 121 and facing the substrate 124, an insulating layer 123 formed on the fence circuit 122, a spacer 127 disposed between the flexible substrate 121 and the substrate 124 to space the flexible substrate 121 and the substrate 124 apart, and a plurality of switch elements 126 each including a pair of contact pads 1261 separately formed on the substrate 124 and the insulating layer 123. The membrane switch assembly 12*b* of the present embodiment further comprises a tamper switch 129 including two switch pads 1291 separately disposed on the insulating layer 123 and the substrate 124 and covered by the fence circuit 122 for protection.

Referring back to FIG. 1, the data entry module 1 may further include a holding member 16. The holding member 16 can be used in combination with the support member 15 to hold the membrane switch assembly 12*a* or 12*b* therebetween. Each of the support member 15 and the holding member 16 may include a protrusion 151 or 161. The protrusions 151 and 161 are disposed with respect to the tamper switch 129 and configured to locally depress the flexible substrate 121 and the substrate 124 to move the switch pads 1291 to engage with each other when the holding member 16, the membrane switch assembly 12*b*, and the support member 15 are assembled together.

In another embodiment, only one of the support member 15 and the holding member 16 includes the protrusion 151 or 161, and either the switch pad 1291 on the insulating layer 123 or the switch pads 1291 on the substrate 124 is moved to form a normally closed tamper switch 129.

Figure 10:
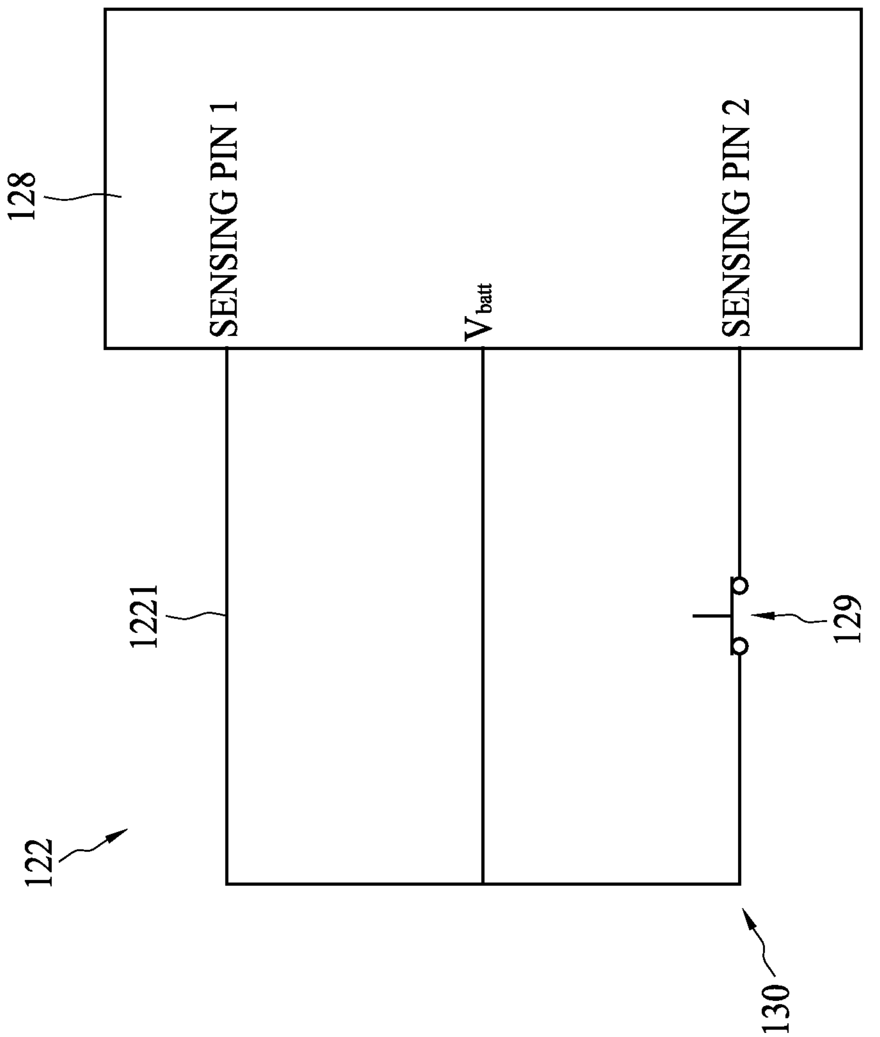
FIG. 10 is a schematic diagram showing a tamper switch connected to a circuit according to one embodiment of the present invention.
Figure 11:
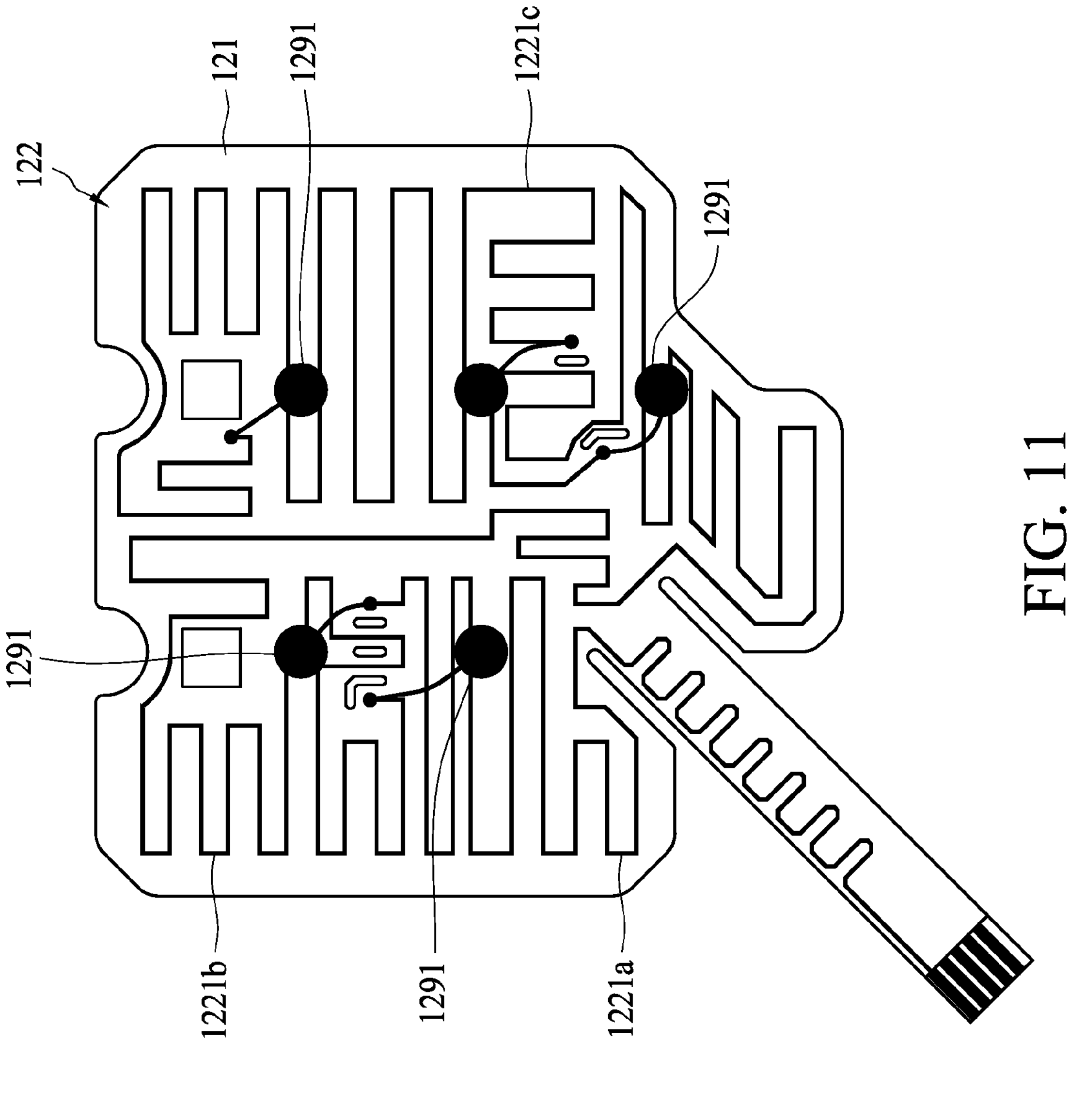
FIG. 11 is a view showing serially connected fence circuit and tamper switches according to one embodiment of the present invention.

FIG. 10 is a schematic diagram showing a tamper switch 129 connected to a circuit 128 according to one embodiment of the present invention. Referring to FIG. 10, the membrane switch assembly 12*b* may include a connecting circuit 130 configured to connect the tamper switch 129 to the circuit 128. In the present embodiment, as shown in FIG. 11, one switch pad 1291 of the tamper switch 129 is coupled to Vbatt and another switch pad 1291 of the tamper switch 129 is coupled to a sensing pin of a circuit 128. If the front housing 13 and the rear housing 14 are separated, the tamper switch 129 will be changed to a normally open condition, and simultaneously, the status of the sensing pin 2 will be changed from high to low, or from low to high. The changed status of the sensing pin 2 of a circuit 128 may trigger the erasing of the stored content of the circuit 128.

Figure 12:
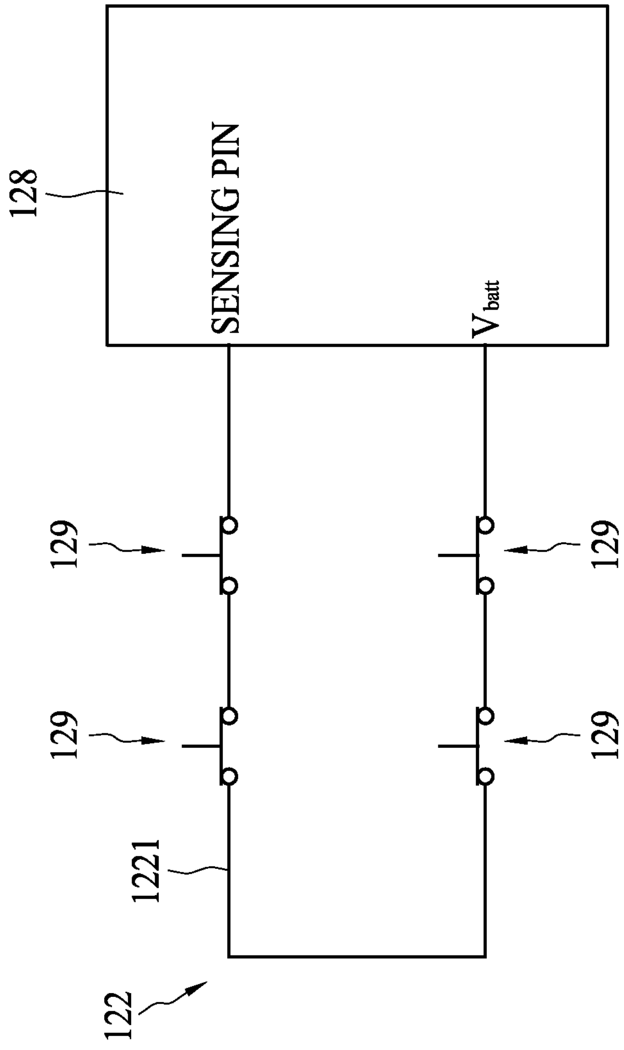
FIG. 12 is a schematic diagram showing plural tamper switches and a fence circuit serially connected and coupled to a circuit according to one embodiment of the present invention.

FIG. 11 shows serially connected fence circuit 122 and tamper switches 129 according to one embodiment of the present invention. FIG. 12 is a schematic diagram showing plural tamper switches 129 and a fence circuit 122 serially connected and coupled to a circuit 128 according to one embodiment of the present invention. Referring to FIGS. 4, 5, 11 and 12, the membrane switch assembly 12*b* may include a plurality of tamper switches 129 configured to be serially connected with the fence circuit 122. In addition, the fence circuit 122 includes a plurality of traces 1221*a*, 1221*b*, and 1221*c* as shown in FIG. 5. One end of each trace 1221*a*, 1221*b*, and 1221*c* is coupled to a corresponding switch pad 1291 on the insulating layer 123 as shown in FIG. 11. As shown in FIG. 4, the switch pads 1291 on the substrate 124 are suitably connected such that the plurality of traces 1221*a*, 1221*b*, and 1221*c* and the plurality of tamper switches 129 are serially connected.

Referring to FIG. 5, the opening 1223 partially exposing a corresponding ground trace 1222 can be formed adjacent to the end of a corresponding trace 1221*a*, 1221*b*, or 1221*c*, or can be formed between the adjacent ends of the trace 1221*a*, 1221*b*, or 1221*c*.

Referring back to FIG. 9, in the present embodiment, the substrate 124 can be a flexible plastic substrate such as a PET (polyethylene terephthalate) film. In one embodiment, the support member 15 can be a printed circuit board. In another embodiment, the support member 15 is a printed circuit board, and the substrate 124 is the support member 15.

Figure 13:
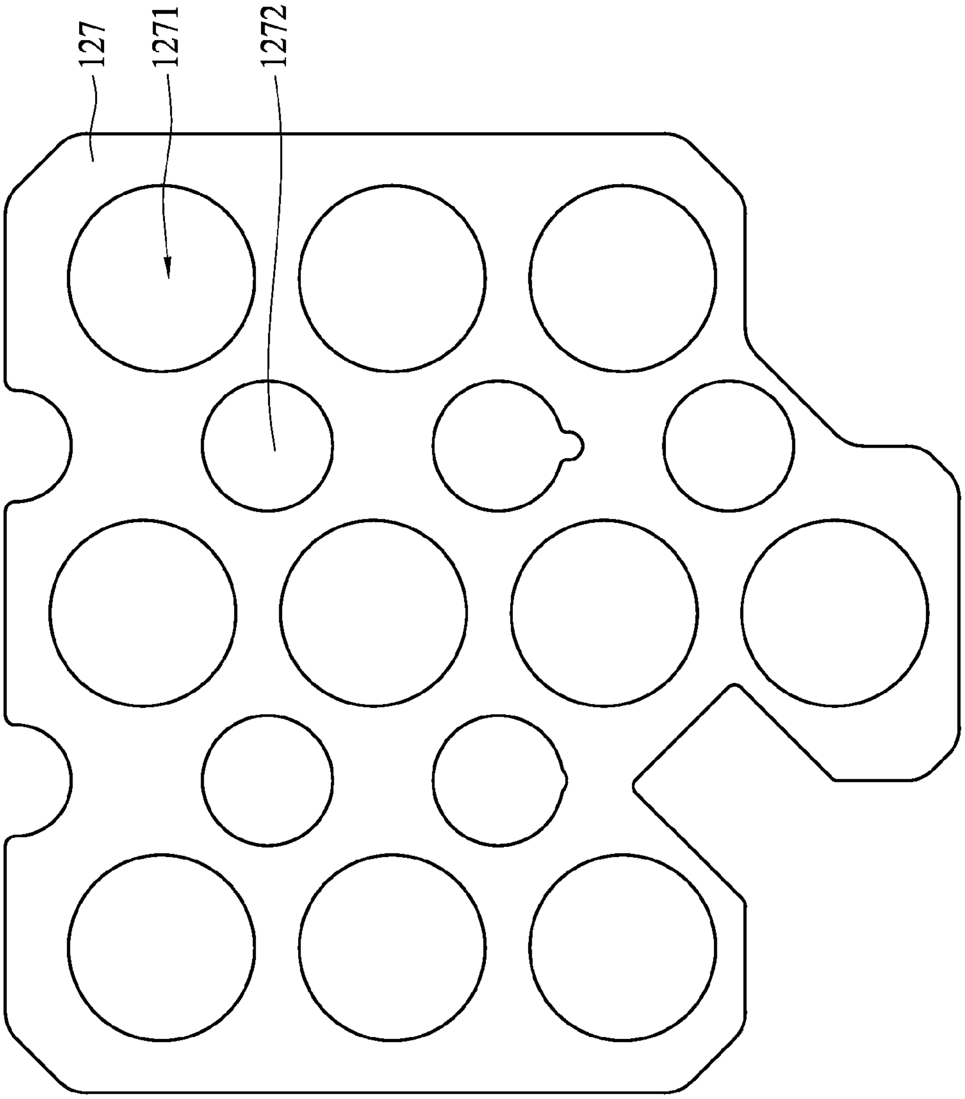
FIG. 13 is a view showing a spacer according to one embodiment of the present invention.

FIG. 13 is a view showing a spacer 127 according to one embodiment of the present invention. Referring to FIGS. 1 and 13, the spacer 127 can be tailored to have a shape similar to that of the substrate 124 or the flexible substrate 121. In the spacer 127, a plurality of apertures 1271 and 1272 are formed with respect to the contact pads 1261 and the tamper switches 129. The spacer 127 can be made of plastic such as PET (polyethylene terephthalate).

In one embodiment, the above-mentioned insulating layer 123 may include a thermoplastic resin such as polyester resin.

In one embodiment, the above-mentioned switch circuit 125 and the fence circuit 122 may include silver.

In summary, a proposed new data entry module includes a switch circuit having plural switch elements operable with input keys and a fence circuit configured to cover the switch circuit for preventing the interrogation of the switch circuit. The data entry module may further include a tamper switch, covered by the fence circuit, for detecting tampering of the data entry module. In one embodiment, the fence circuit and the tamper switch operate independently. In another embodiment, the tamper switch is serially connected with the fence circuit.

Clearly, following the description of the above embodiments, the present invention may have many modifications and variations. Therefore, the scope of the present invention shall be considered with the scopes of the dependent claims. In addition to the above detailed description, the present invention can be broadly embodied in other embodiments. The above-described embodiments of the present invention are intended to be illustrative only, and should not become a limitation of the scope of the present invention. Numerous alternative embodiments may be devised by persons skilled in the art without departing from the scope of the following claims.

What is claimed is:

1. A data entry module, comprising:
- a flexible substrate;
- a fence circuit formed on the flexible substrate and comprising at least one trace routed in a meandering manner;
- an insulating layer formed on the fence circuit;
- a substrate spaced from the insulating layer;
- a switch circuit including a plurality of switch elements, each having two contact pads separately disposed on the substrate and the insulating layer, wherein the fence circuit is configured to cover the switch circuit for preventing the interrogation of the switch circuit;
- a tamper switch covered by the fence circuit and including two switch pads separately disposed on the insulating layer and the substrate; and
- a holding member disposed on the flexible substrate and including a protrusion configured to depress the flexible substrate to make the two switch pads engage each other.

2. The data entry module of claim 1, wherein the tamper switch is serially connected with the fence circuit.

3. The data entry module of claim 1, wherein the substrate is a printed circuit board.

4. The data entry module of claim 1, further comprising:
- a tamper switch covered by the fence circuit and including two switch pads separately disposed on the insulating layer and the substrate; and
- a support member configured to support the substrate and including a protrusion configured to depress the substrate to make the two switch pads engage each other.

5. The data entry module of claim 4, wherein the tamper switch is serially connected with the fence circuit.

6. The data entry module of claim 4, wherein the support member is a printed circuit board.

7. The data entry module of claim 1, wherein the flexible substrate comprises polyethylene terephthalate.

8. The data entry module of claim 1, wherein the insulating layer comprises polyester resin.

* * * * *